(12) United States Patent
Tominaga

(10) Patent No.: US 6,600,231 B2
(45) Date of Patent: Jul. 29, 2003

(54) FUNCTIONAL DEVICE UNIT AND METHOD OF PRODUCING THE SAME

(75) Inventor: Atsushi Tominaga, Kawasaki (JP)

(73) Assignee: Mitutoyo Corporation, Kawasaki (JP)

( * ) Notice: Subject to any disclaimer, the term of this patent is extended or adjusted under 35 U.S.C. 154(b) by 130 days.

(21) Appl. No.: 09/851,994

(22) Filed: May 10, 2001

(65) Prior Publication Data

US 2002/0008325 A1 Jan. 24, 2002

(30) Foreign Application Priority Data

May 11, 2000 (JP) ........................................ 2000-138818

(51) Int. Cl.[7] .............................................. H01L 23/48
(52) U.S. Cl. ...................... 257/778; 257/777; 257/738; 257/257; 257/737; 438/48; 438/108; 438/106; 438/118; 438/127; 438/629; 438/672; 438/734; 438/737
(58) Field of Search ................................. 257/778, 777, 257/738, 257, 737; 438/106, 118, 127, 629, 672, 734, 737, 48, 108

(56) References Cited

U.S. PATENT DOCUMENTS

| | | | |
|---|---|---|---|
| 3,316,458 A | | 4/1967 | Jenny |
| 3,908,075 A | | 9/1975 | Jackson et al. |
| 3,942,245 A | | 3/1976 | Jackson et al. |
| 4,896,930 A | * | 1/1990 | Tsuchitani et al. ....... 350/96.12 |
| 5,156,980 A | * | 10/1992 | Hisa ............................. 438/69 |
| 5,647,122 A | | 7/1997 | Launay et al. |
| 5,808,878 A | * | 9/1998 | Saito et al. ................. 361/818 |
| 6,127,833 A | * | 10/2000 | Wu et al. ..................... 10/200 |
| 6,352,879 B1 | * | 3/2002 | Fukui et al. ................ 438/106 |

FOREIGN PATENT DOCUMENTS

| | | |
|---|---|---|
| JP | A 2000-150775 | 5/2000 |
| JP | A 2000-193421 | 7/2000 |

OTHER PUBLICATIONS

IBM TDB Single Chip Carrier, Sep. 1969, vol. 12, Issue 4, P 538.*
UK Search Report.

* cited by examiner

Primary Examiner—Matthew Smith
Assistant Examiner—Belur V Keshavan
(74) Attorney, Agent, or Firm—Oliff & Berridge, PLC

(57) ABSTRACT

An implementation base (10) is formed of a silicon substrate (11) having a recess (12) on a surface. Wire layers (13) are formed on the silicon substrate (11), continuously extending from the bottom of and via the side of the recess (12) to the top surface. A semiconductor chip (14) is implemented in the recess (12) of the implementation base (10) in a flip-chip manner to configure a functional device unit.

13 Claims, 13 Drawing Sheets

FUNCTIONAL DEVICE UNIT AND METHOD OF PRODUCING THE SAME

BACKGROUND OF THE INVENTION

1. Field of the Invention

The present invention relates to a functional device unit, which includes a semiconductor device implemented thereon, and method of producing the unit.

2. Description of the Related Art

Recently, as the MEMS (Micro Electro Mechanical Systems) technology progresses, various functional devices are promoted to combine with others. Ideally, it is preferable to integrate various functional devices, beginning with semiconductor devices, monolithically on an identical substrate. Considering electromagnetic and mechanical characteristics of each functional device, however, the monolithic integration is not applicable in many cases practically. In these cases, a method of hybrid implementation is employed to implement different functional devices in a batch and then combine them.

An example of such the hybrid implementation includes a structure for implementing semiconductor devices such as LSI, light emitting diode (LED), laser diode (LD) and photodiode (PD) in a recess (cavity) formed on a silicon base and the like. This implementation structure can be applied, for example, to a sensor head in an optical encoder.

FIG. 1 shows an example of such the implementation structure for semiconductor devices. A silicon substrate 1 has a recess (cavity) 2 formed thereon, which is employed to implement a semiconductor device 3 therein. The semiconductor device 3 has terminal pads that are connected to terminal pads 4 formed on a surface outside the cavity 2 via bonding wires 5.

The implementation structure shown in FIG. 1 has the following disadvantages. First, if the cavity has a deep step, it raises a difficulty for wire bonding and needs longer wires additionally. Therefore, disturbances such as vibrations easily influence on the structure, thereby reducing its reliability. In addition, a large stray capacitance of the wire effects electrically on the structure to cause performance degradations such as a signal delay.

SUMMARY OF THE INVENTION

The present invention has an object to provide a functional device unit capable of having an improved reliability and performance, and method of producing the unit.

A functional device unit, according to the present invention, includes an insulating substrate having a recess formed in a surface thereof; a wiring layer patterned on the surface of the substrate, the wiring layer continuously extending from the bottom of and via the side of the recess to the top surface of the substrate; and a semiconductor device implemented in the recess of the substrate in a flip-chip manner.

According to the present invention, a base for implementing semiconductor devices has a recess formed thereon. A wiring layer is formed on the bottom of the recess and continuously extends therefrom via the side of the recess to the top surface of the substrate. A semiconductor device is mounted on the implementation base in a flip-chip manner. Therefore, the functional device unit obtained is not influenced from mechanical disturbances and has high reliability, differing from those obtained by the conventional method of implementation using the wire bonding. Electrically, it can reduce a signal delay and achieve a high performance.

The functional device according to the present invention may serve, for example, as a sensor head of an optical encoder. In this case, a photodetector chip is implemented as the semiconductor device.

A method of producing a base for implementing a functional device, according to the present invention, has the steps of forming a recess in a surface of an insulating substrate; burying an insulating layer in the recess to planarize the substrate, the insulating layer consisting of a material different from the substrate; forming a photoresist mask over the substrate planarized with the insulating layer buried, the photoresist mask having a groove for wire-burying continuously extending from the top of the insulating layer to the outside of the recess; etching the insulating layer to remove parts exposing through the groove of the photoresist mask; depositing a conductive layer over the resist mask remaining on the substrate to form a wiring layer in the groove, the wiring layer continuously extending from the bottom of and via the side of the recess to the top surface of the substrate; and removing the photoresist mask and the insulating layer successively.

The method of producing according to the present invention employs the step of burying an insulating layer and the step of lifting-off to form the wiring layer on the substrate surface that has a step. That is, deposition of the insulating layer planarizes the recessed surface of the substrate. Then, lithography is employed to form a photoresist mask having a groove for wire burying on the planarized substrate, and a conductive layer is buried in the groove. Patterning the conductive layer is performed by the lift-off method, which removes the grounding insulating layer and photoresist mask. As a result, even though the recess in the implementation base has a deep step, the wiring layer can be reliably formed across the step.

A method of producing a functional device unit, according to the present invention, has the steps of forming a recess in a surface of an insulating substrate; burying an insulating layer in the recess to planarize the substrate, the insulating layer consisting of a material different from the substrate; forming a photoresist mask over the substrate planarized with the insulating layer buried, the photoresist mask having a groove for wire-burying continuously extending from the top of the insulating layer to the outside of the recess; etching the insulating layer to remove parts exposing trough the groove of the photoresist mask; depositing a conductive layer over the photoresist mask remaining on the substrate to form a wiring layer in the groove, the wiring layer continuously extending from the bottom of and via the side of the recess to the top surface of the substrate; removing the photoresist mask and the insulating layer successively; and implementing at least one semiconductor device in the recess of the substrate in a flip-chip manner.

Other features and advantages of the invention will be apparent from the following description of the preferred embodiments thereof.

BRIEF DESCRIPTION OF THE DRAWINGS

The present invention will be more fully understood from the following detailed description with reference to the accompanying drawings in which.

DETAILED DESCRIPTION OF THE PREFERRED EMBODIMENTS

Figure 1:
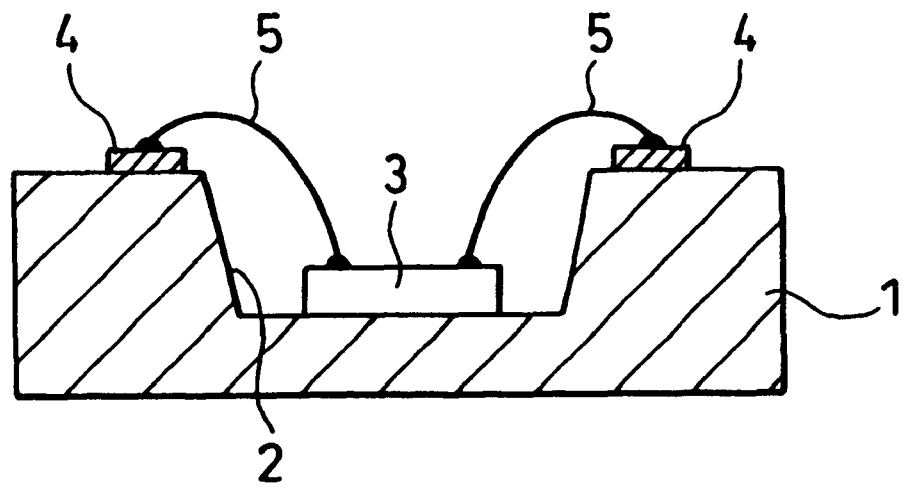
FIG. 1 is a cross sectional view showing a structure for implementing semiconductor devices in the art.
Figure 2:
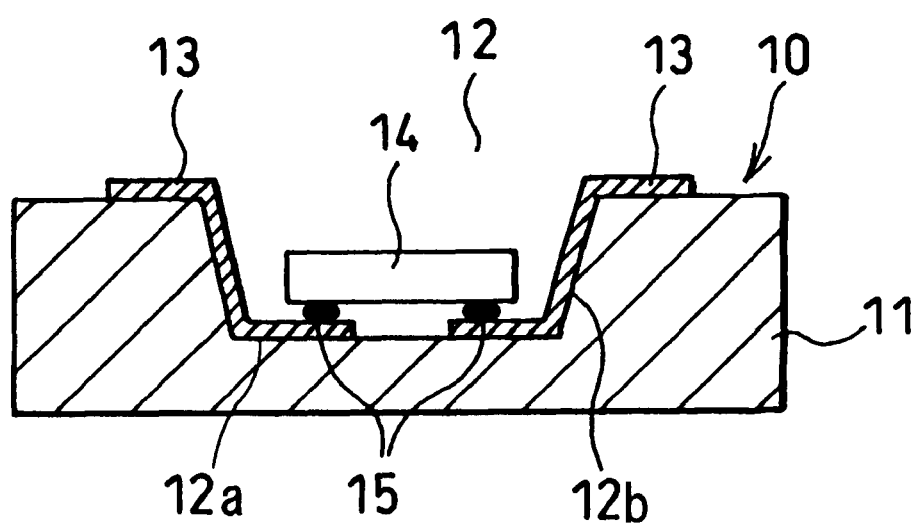
FIG. 2 is a cross sectional view showing a structure for implementing semiconductor devices according to an embodiment of the present invention.

FIG. 2 shows a cross-sectional structure of a functional device unit according to an embodiment of the present invention. An implementation base 10 is formed of a silicon substrate 11 that has a high resistivity and is substantially insulating. A recess 12 is formed on a surface of the silicon substrate 11. A wiring layer 13 is formed in the recess 12, continuously extending from the bottom 12a to the top surface via the side 12b of the recess 12. A semiconductor device chip 14 is mounted on the implementation base 10 in a flip-chip manner. That is, the semiconductor chip 14 is face-down bonded such that terminal pads located on the surface can connect through bumps 15 with end portions of the wiring layers 13 located on the recess bottom 12a.

In the implementation base 10 of this embodiment, as described above, the wiring layer 13 is formed to continuously extend from the bottom 12a of the recess 12 to the top surface. Such the wiring layer 13 is difficult to form, if the recess 12 has a deep step, with a method of patterning a conductive layer using a usual lithography process. Then, in this embodiment, the implementation base 10 is produced in accordance with the following method. FIGS. 3A–B through 8A–B are a perspective view showing each step of producing the base and a cross sectional view thereof taken along an I–I' line.

Figure 3A:
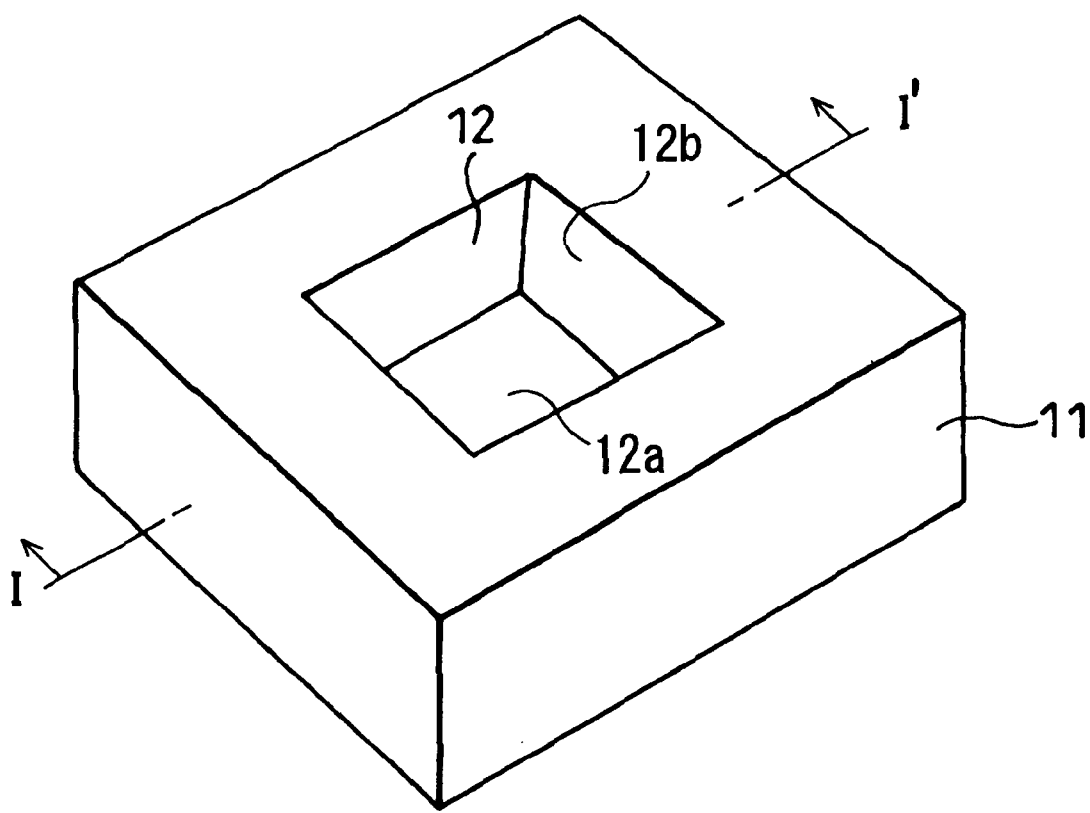
FIGS. 3A and 3B are a perspective view showing the step of processing a recess in an implementation base of the above embodiment and a cross sectional view thereof taken along an I–I' line.
Figure 3B:
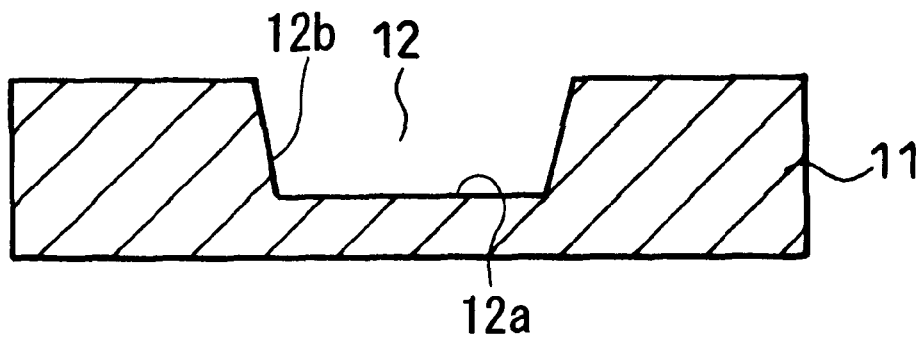

First, as shown in FIGS. 3A–B, anisotropic etching is performed to form a recess 12 on the silicon substrate 11. The recess 12 is a cavity with a step that is equal to or deeper than a thickness of a semiconductor chip to be implemented. Specifically, wet etching using an aqueous solution of KOH, TMAH or EDP is employed to form the recess 12. Alternatively, high concentration plasma etching such as ICP-RIE may also be utilized. Process conditions are selectively determined so that a side 12b of the recess 12 is tapered, and the bottom 12a and side 12b of the recess 12 have such a surface roughness that does not influence on a later film formation of a conductive layer.

Figure 4A:
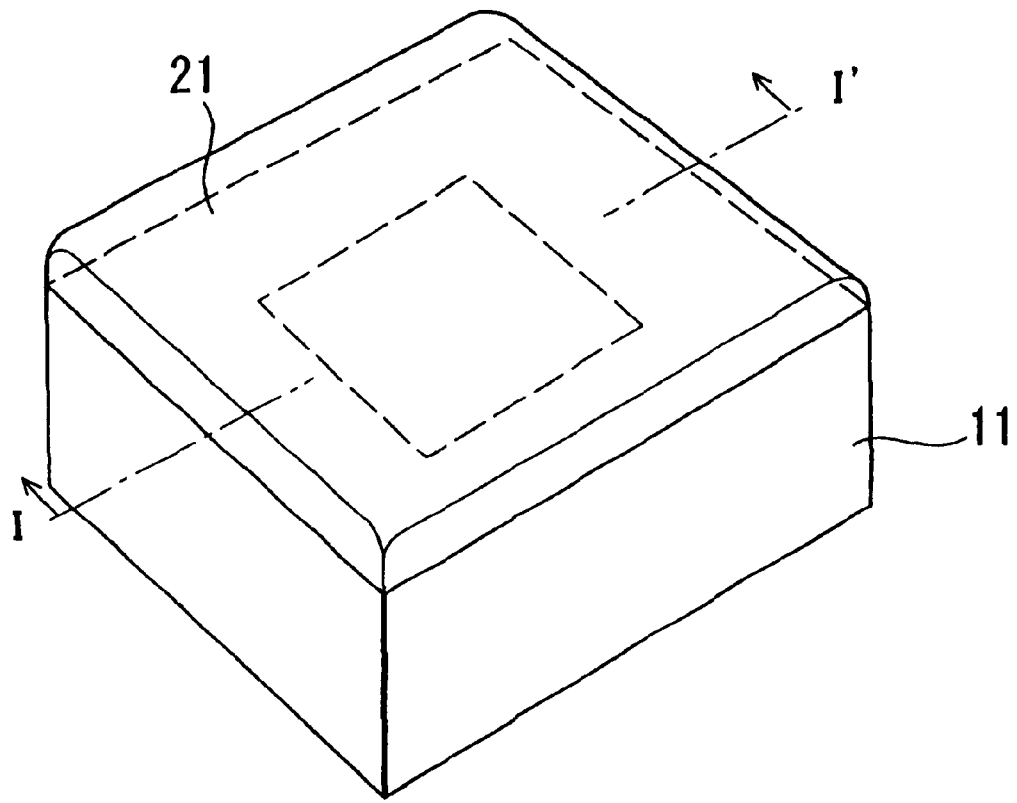
FIGS. 4A and 4B are a perspective view showing the step of depositing an insulating layer on the implementation base of the above embodiment and a cross sectional view thereof taken along an I–I' line.
Figure 4B:
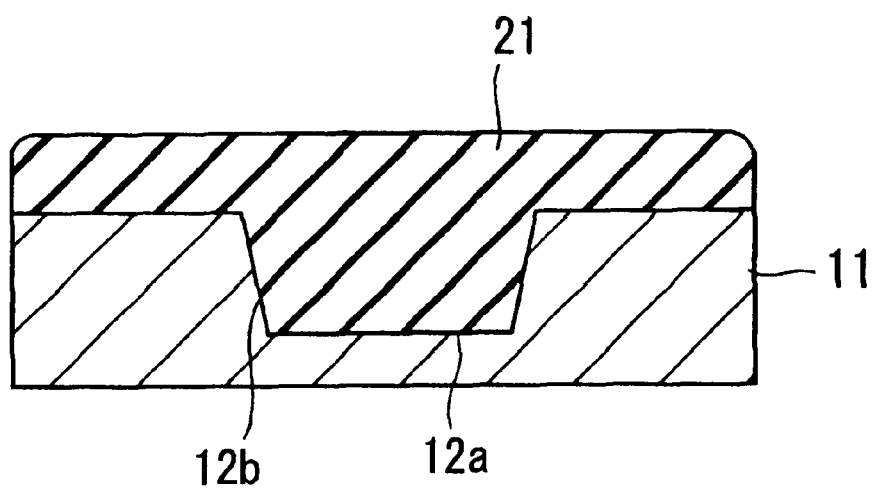

Next, as shown in FIGS. 4A–B, an insulating layer 21 is deposited on the substrate 11. The insulating layer 21 is composed of a different material from the substrate 11. For the insulating layer 21, an organic insulating layer (such as resin layer, photoresist layer and the like) formed by spin coating, or an inorganic insulating layer (such as SiO2, SiN and the like) formed by CVD or sputtering can be used. It is preferable that the insulating layer 21 has such a character that can be uniformly filled up in the recess 12, and can be easily removed by O2 plasma etching. From this viewpoint, the SOG (Spin On Glass) layer, that is a coated insulating layer, is the optimum as the insulating layer 21.

Figure 5A:
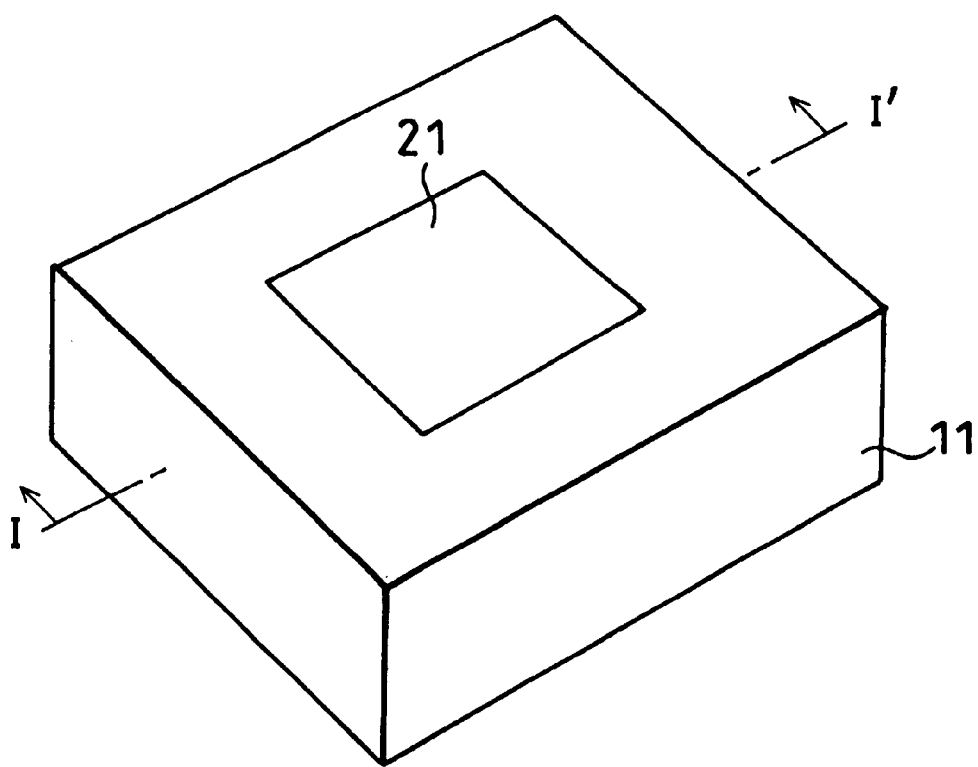
FIGS. 5A and 5B are a perspective view showing the step of planarizing the implementation base of the above embodiment and a cross sectional view thereof taken along an I–I' line.
Figure 5B:
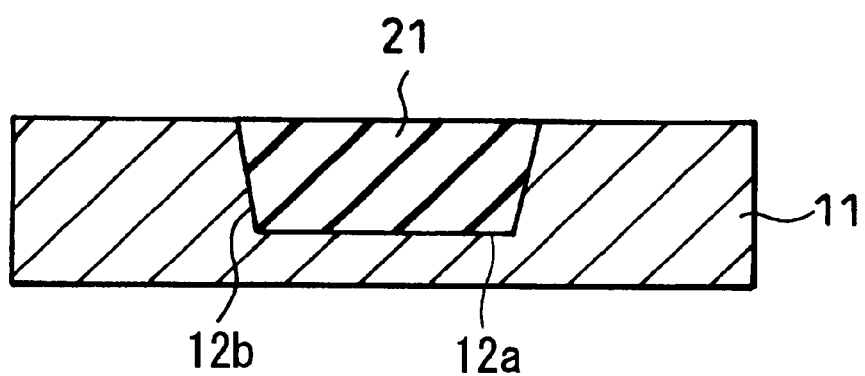

Subsequently, a method of CMP (Chemical Mechanical Polishing) is employed to polish the insulating layer 21 so that the insulating layer 21 buried in the recess 12 forms a state of planarized surface as shown in FIGS. 5A–B. The CMP condition is optimally determined to prevent the insulating layer 21 from curling up at edges of the recess 12 and to match the position of the surface of the insulating layer 21 just with that of the top surface of the substrate 11 outside the recess 12.

Figure 6A:
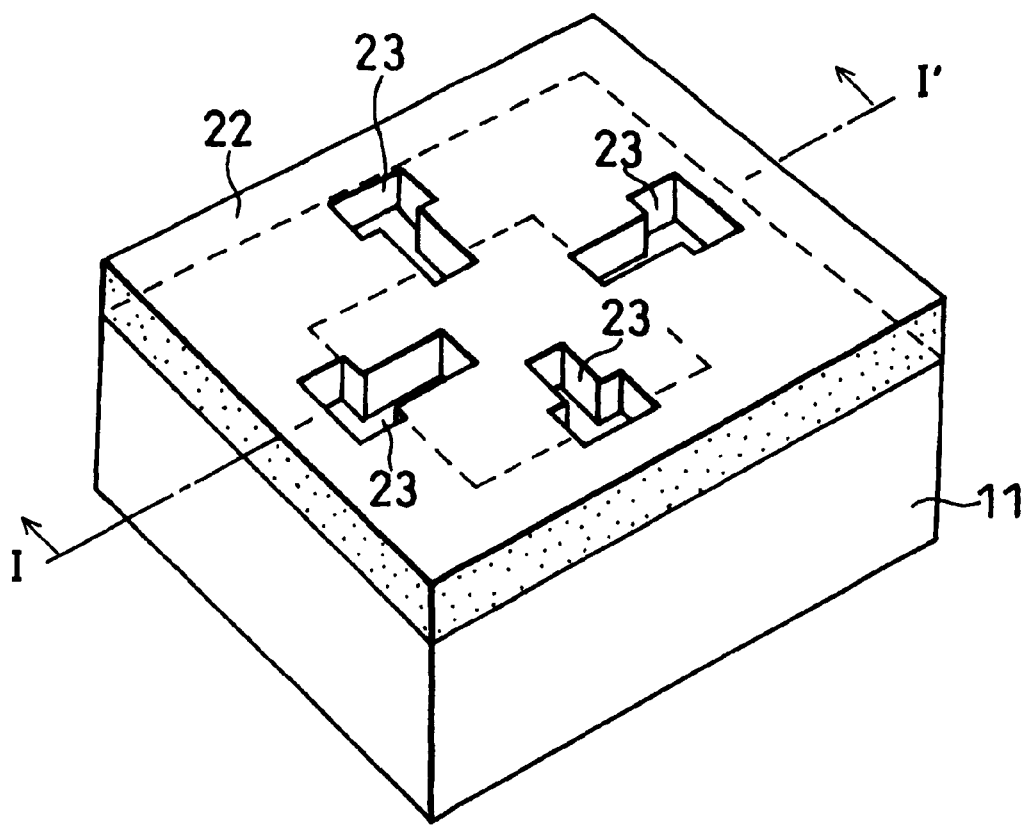
FIGS. 6A and 6B are a perspective view showing the step of lithography for the implementation base of the above embodiment and the step of etching the insulating layer and a cross sectional view thereof taken along an I–I' line.
Figure 6B:
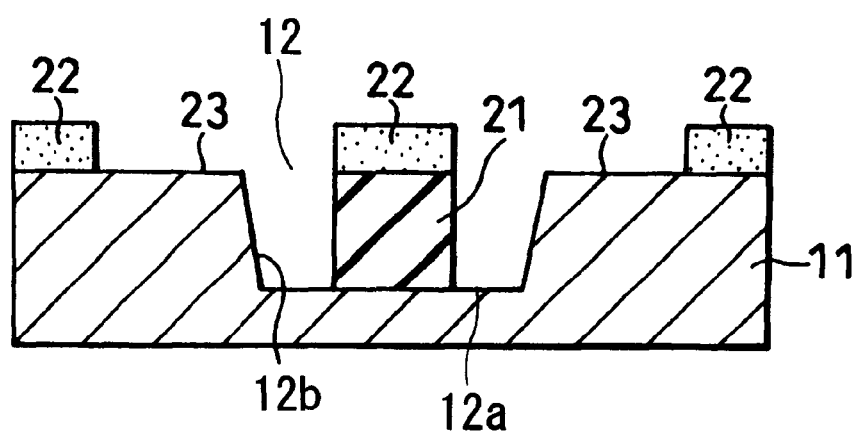

Thereafter, a lithography is performed to pattern a photoresist mask 22 on the planarized substrate as shown in FIGS. 6A–B and then the photoresist mask 22 is employed to etch the insulating layer 21. It is preferable that the photoresist mask 22 has a sufficient resistance against O2 plasma. As shown in the FIGS. 6A and 6B, the resist mask 22 is patterned to have grooves 23 for wire burying, corresponding to a wiring pattern to be formed later. Each of the grooves 23 has a pattern that extends over the step of the recess 12. The insulating layer 21 exposed through the groove 23 is etched almost vertically.

For etching of the insulating layer 21, such an etching condition is employed that has a large selective ratio to the silicon substrate 11. Specifically, reactive ion etching (RIE) with $O_2$ plasma may be used, for example. This etching can remove parts of the insulating layer 21 only exposed through the groove 23, barely etching the substrate 11. If the recess 12 has a depth of several 100 $\mu$m, for example, low pressure RIE with inductively coupled plasma (ICP-RIE) is effective.

Figure 7A:
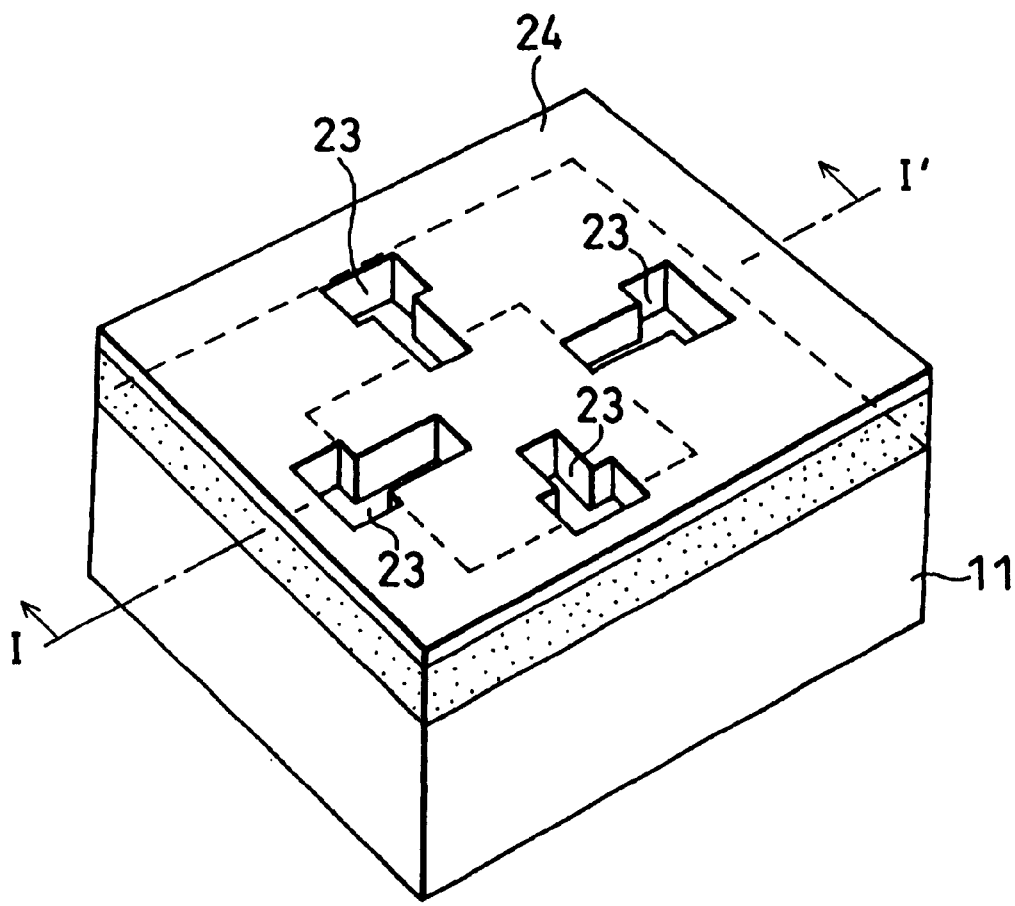
FIGS. 7A and 7B are a perspective view showing the step of forming a wiring layer in the implementation base of the above embodiment and a cross sectional view thereof taken along an I–I' line.
Figure 7B:
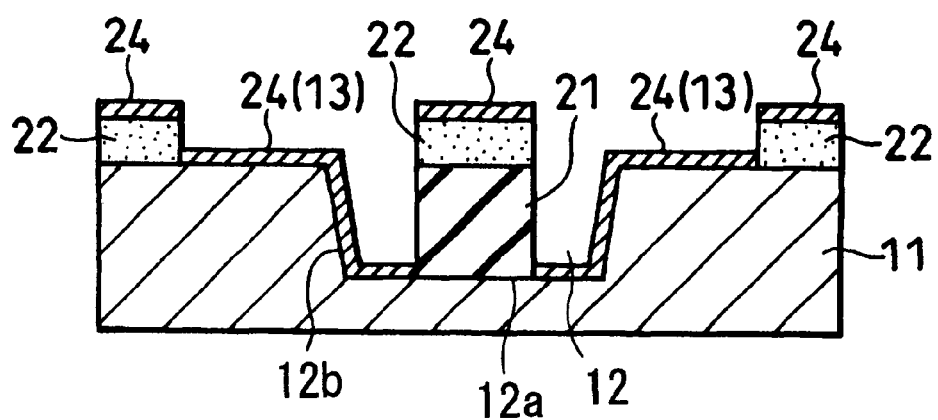

Next, remaining the photoresist mask 22, as shown in FIGS. 7A–B, an Al layer 24 is deposited on it as a conductive layer. The Al layer 24 formed through the groove 23 of the resist mask 22 defines a wiring layer 13 that extends over the step of the recess 12. That is, the wiring layer 13 extends continuously from the bottom 12a of the recess 12 via the side 12b to the upper surface. For deposition of the Al layer 24, sputtering or CVD, that has good step coverage, may be employed. If the Al layer 24 is deposited excessively thick on the sides of the recess 12, however, it causes a trouble on etching to remove the insulating layer 21 later. Accordingly, it is preferable to select a deposition condition such that an Al layer 24 with the minimum thickness necessary for a wiring layer is formed on the side 12b of the recess 12.

Figure 8A:
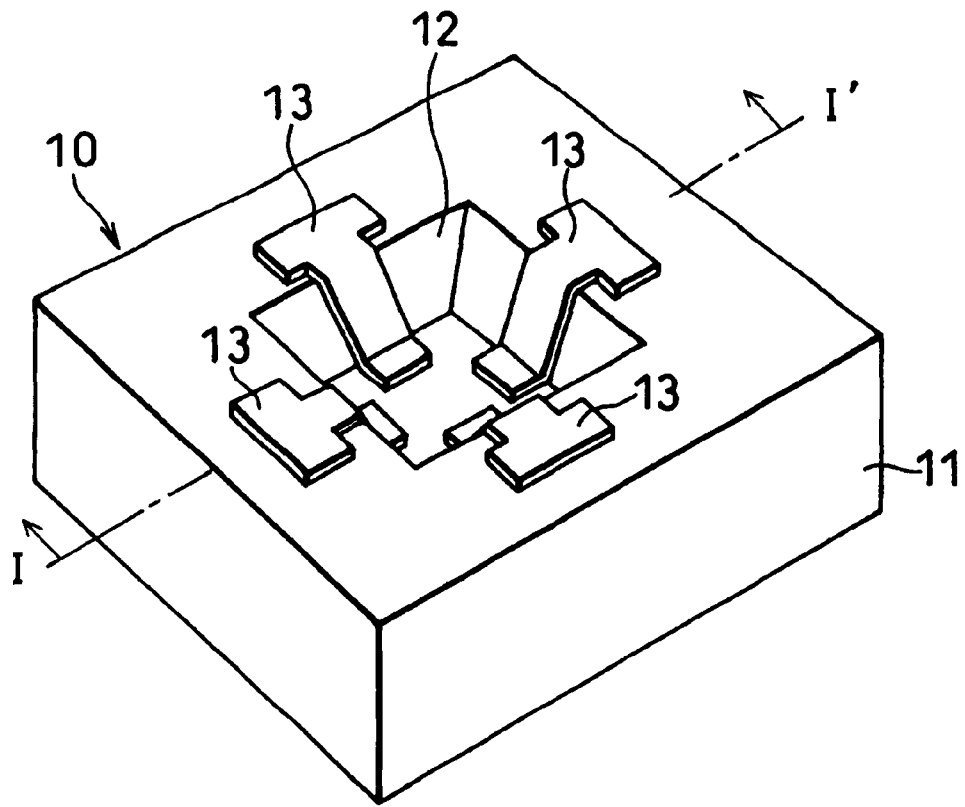
FIGS. 8A and 8B are a perspective view showing the step of lifting-off for the implementation base of the above embodiment and a cross sectional view thereof taken along an I–I' line.
Figure 8B:
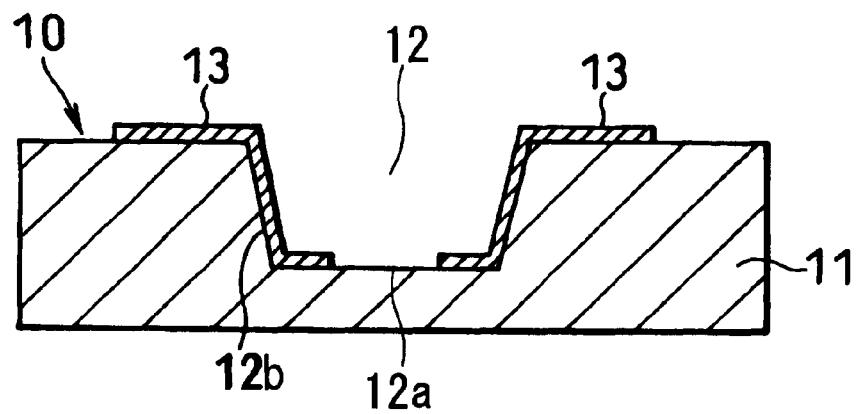

Thereafter, as shown in FIGS. 8A–B, the resist mask 22 is removed to lift-off the unnecessary Al layer 24 thereon at the same time. Further, the insulating layer 21 remaining in the recess 12 is etched and removed to finish the implementation base 10. If the insulating layer 21 is formed of an organic material polymer) film, the use of an organic solvent can easily remove it without etching the remaining parts.

According to the embodiment described above, the method can produce the implementation base 10 including the wiring layer 13 that is formed thereon and extends from the bottom 12a of the recess 12 to the upper surface via the side 12b. Flip-chip implementation of the semiconductor device 14 in the implementation base 10 as shown in FIG. 2 can provide a functional device unit that is excellent in mechanical reliability and electrical performance.

Figure 9A:
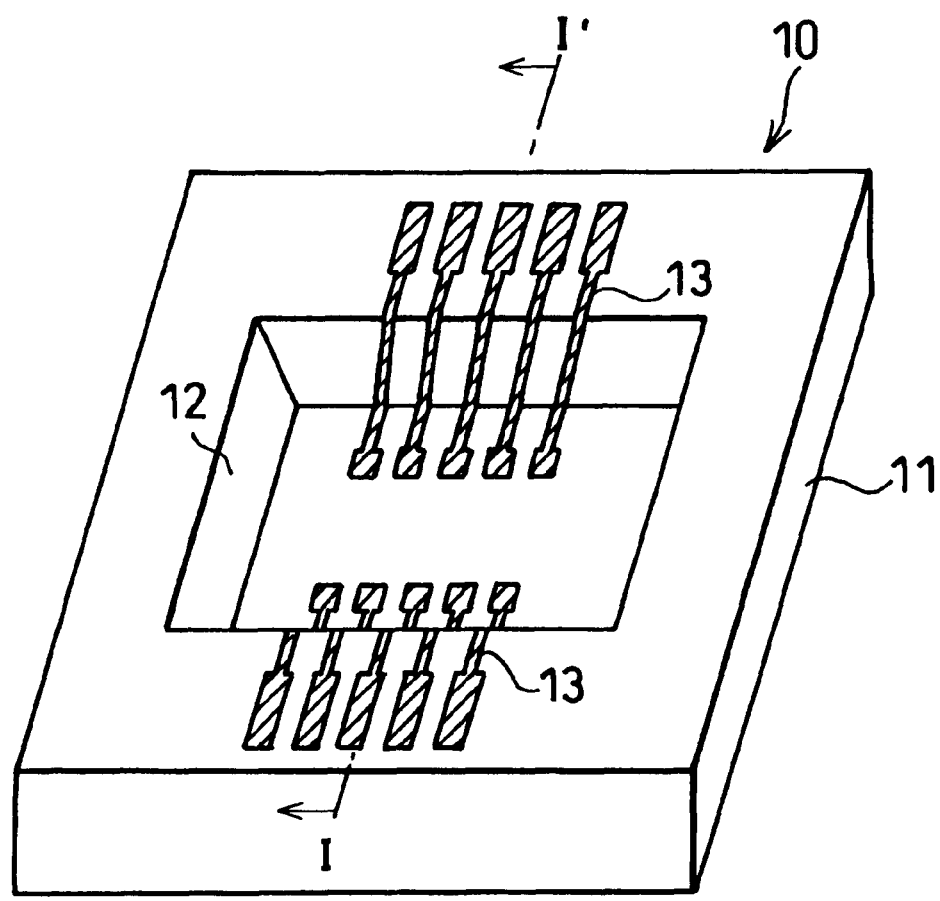
FIGS. 9A and 9B are a perspective view showing an implementation base in an embodiment applied to a sensor head of an optical encoder and a cross sectional view thereof taken along an I–I' line.
Figure 9B:
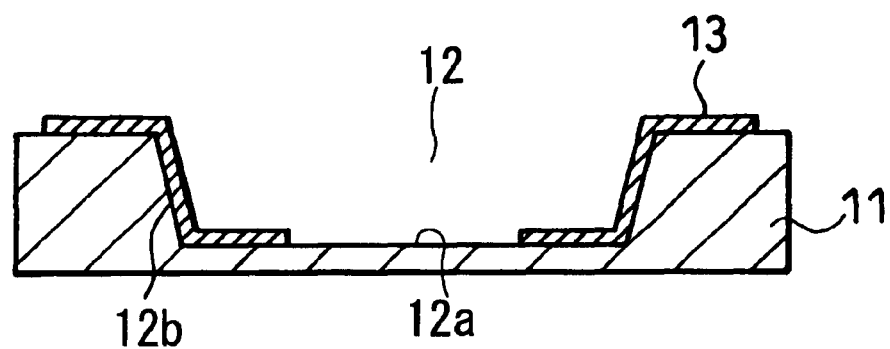

A sensor head (i.e., pick-up) of an optical encoder is an example of functional devices, to which the present invention is applicable. In this case, the semiconductor device chip 14 is a photodetector chip. A specific configuration applied to a sensor head of an optical encoder will be described with reference to FIGS. 9A–B through 11A–B. FIGS. 9A–B show a perspective view of the implementation base 10 including the wiring layer 13 formed in accordance with the aforementioned process steps and a cross sectional view thereof taken along an I–I' line.

Figure 10A:
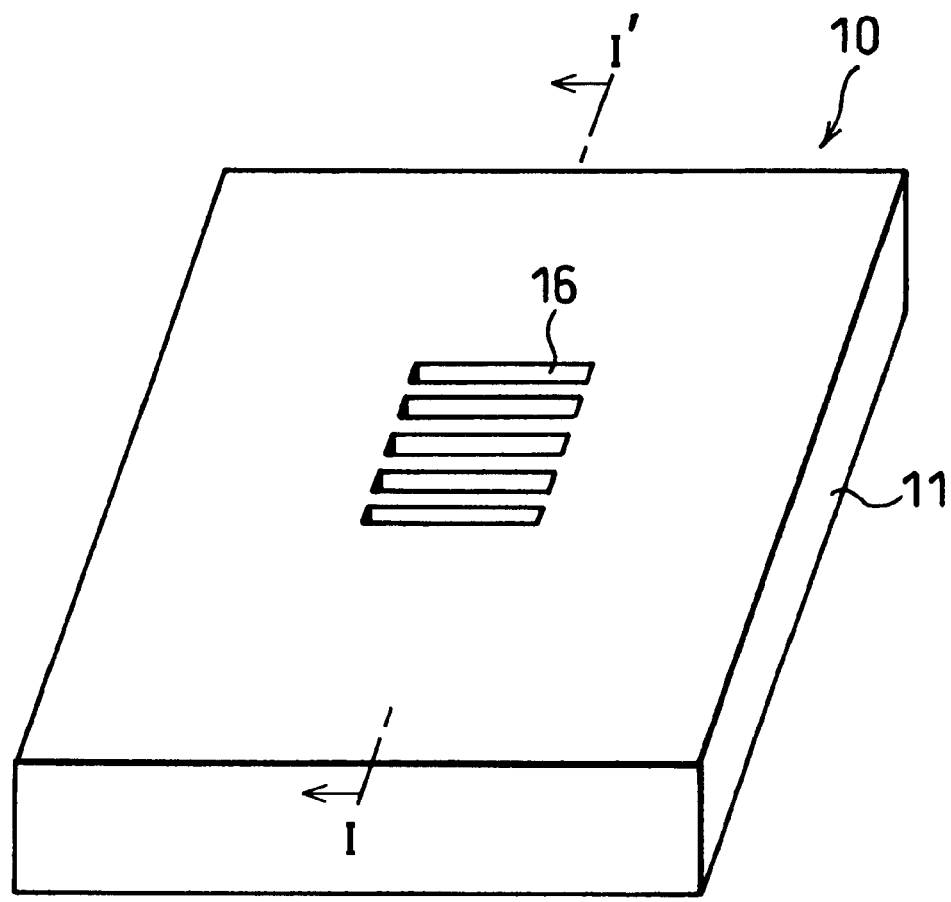
FIGS. 10A and 10B are a perspective view showing a structure of the above implementation base having slits formed on the recess bottom thereof and a cross sectional view thereof taken along an I–I' line.
Figure 10B:
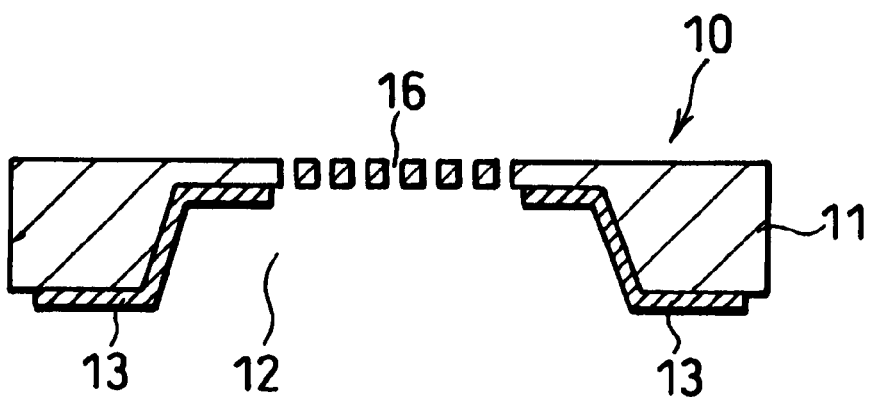

Then, as shown in FIGS. 10A–B, lithography and ICP-RIE process are employed to form a plurality of slits 16 starting from the back surface of the implementation base 10 through the silicon substrate 11 that remains on the bottom of the recess 12. FIGS. 10A–B show the base in FIGS. 9A–B upside down. The slits 16 are serve as optical gratings (index gratings), which are positioned in front of photoreceiving surfaces of a photodetector chip 14 that is mounted on the implementation base 10, to modulate a light transmitted through or reflected from a scale and guide it to the photodetector chip 14.

Figure 11A:
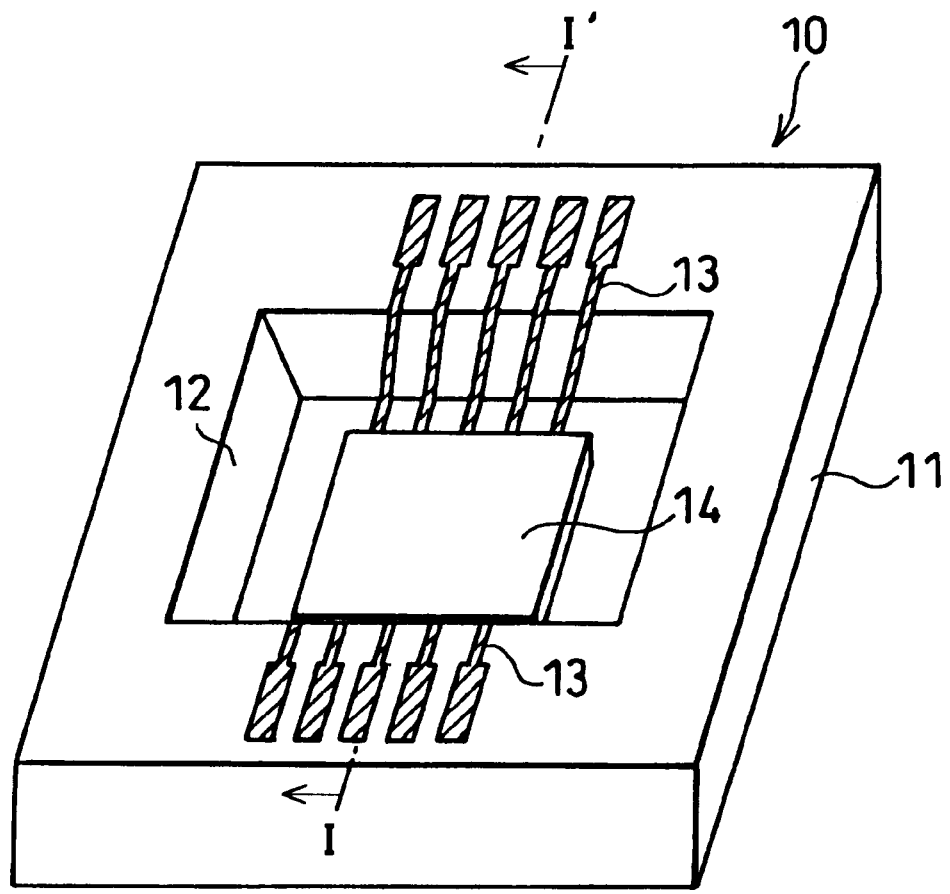
FIGS. 11A and 11B are a perspective view showing a structure of a sensor head including the implementation base and a photodetector IC mounted thereon and a cross sectional view thereof taken along an I–I' line.
Figure 11B:
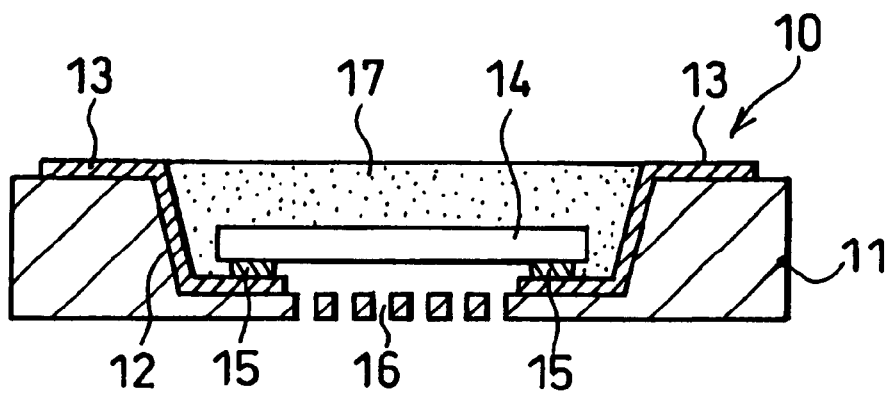

Then, as shown in FIGS. 11A–B, the photodetector chip 14 is flip-chip bonded, facing its photoreceptive surfaces to the slits 16. It is preferable that a signal processing circuit for processing the received signals output from the photodetetor is integrally formed in the chip 14. Preferably, the photodetector chip 14 mounted is sealed in a plastic 17 as shown in FIG. 11B.

Thus obtained sensor head of the optical encoder can be thin and highly reliable.

The present invention is not limited to the above embodiment. Rather, it is also applicable to implementations of LSI chip, LED chip, LD chip and the like in similar structures. Although the above embodiment exemplifies the implementation of one semiconductor device chip, the present invention is similarly applicable to a hybrid device that includes a plurality of devices implemented therein.

Figure 12:
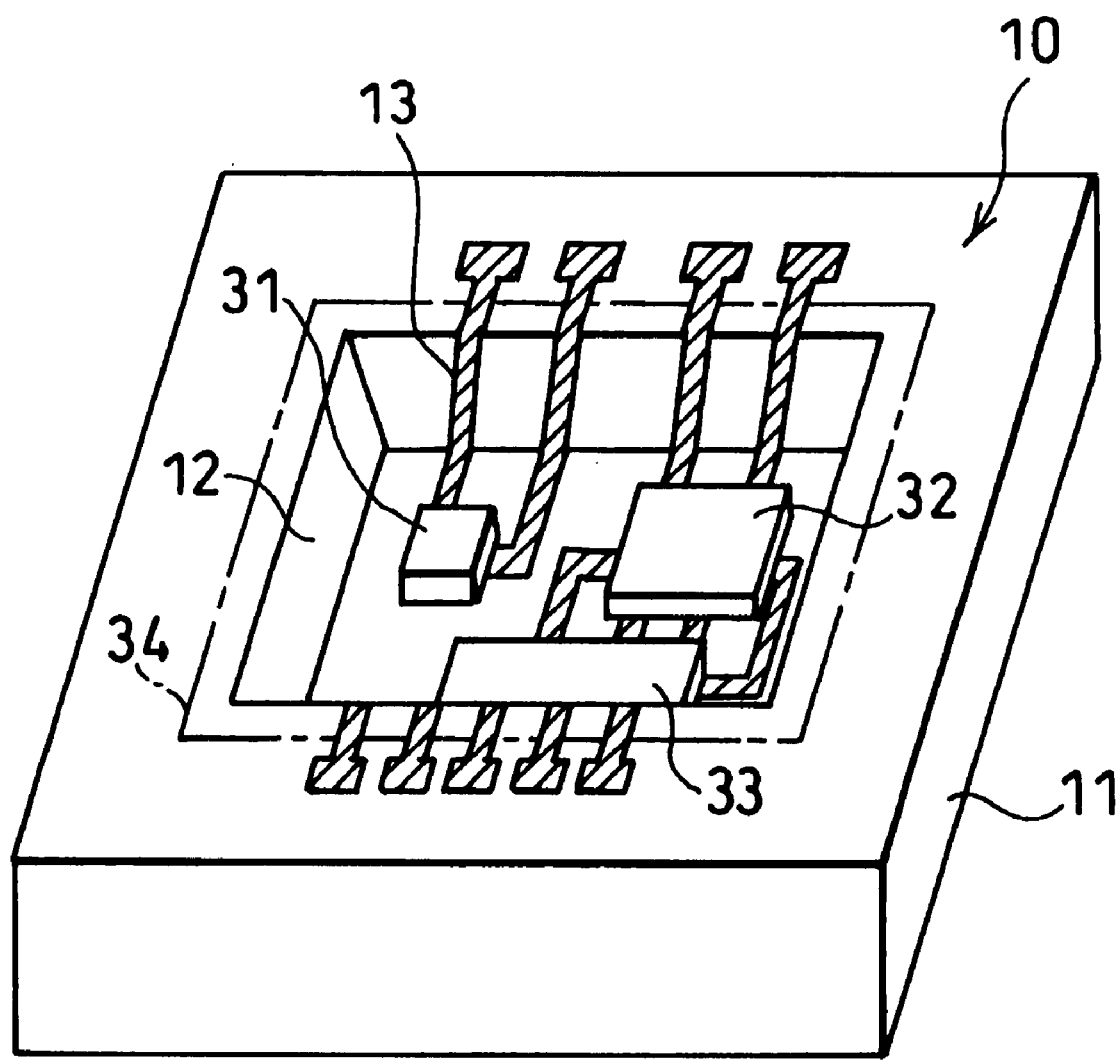
FIG. 12 is a perspective view showing a hybrid optical detector unit according to another embodiment.

For example, FIG. 12 shows another embodiment, which is applied to a hybrid optical detector unit. An implementation base 10 has the same structure and can be produced through the same process steps as those in the above embodiments. On the implementation base 10, a semiconductor light emitting device chip of surface emission type (for example, LED chip) 31, a semiconductor photodetector device chip (for example, photodetector IC chip) 32, and a signal processing IC chip 33 for processing a detected signal output from the photodetector device chip 32 are implemented in a flip-chip manner. Apertures for light transmission and detection are previously opened at parts on the bottom of the recess 12 where the LED chip 31 and the photodetector device chip 32 are to be mounted. A cover 34 is applied, as shown with a chain line, over the recess 21 that contains the devices implemented therein.

Thus obtained photo-detector unit is compact and hybrid.

Figure 13:
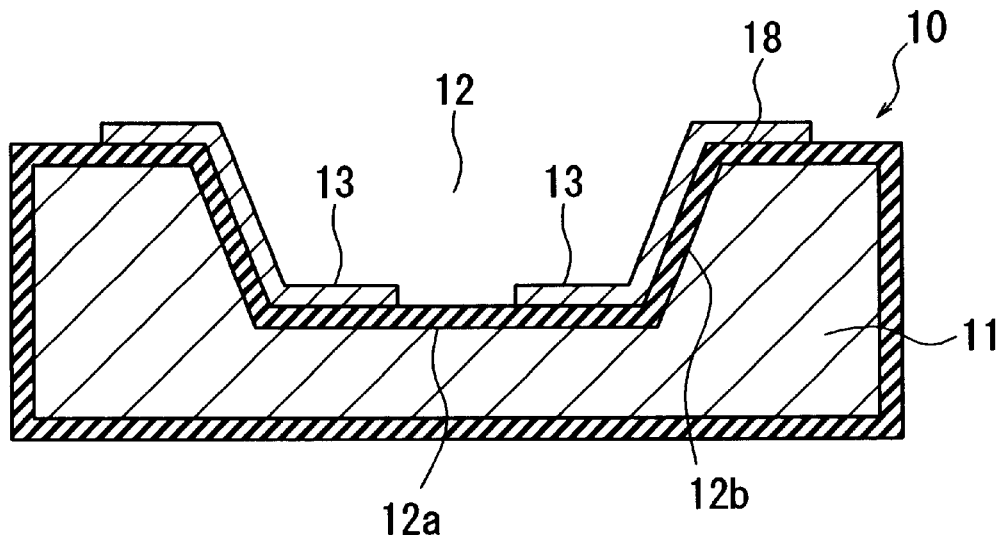
FIG. 13 shows another implementation base formed of a silicon substrate.

In the above-described embodiment, it is necessary for the implementation base 10 that Si substrate 11 has a sufficiently high resistivity. If the leakage current that flows between the wiring layers 13 via the substrate 11 is not negligible small, as shown in FIG. 13, it is effective to form an insulating film 18 on the surface of the silicon substrate 11. The insulating film 18 is, for example, a silicon dioxide film formed by thermal oxidation. In detail, after forming the recess 12 in the silicon substrate 11 as shown in FIGS. 3A and B, and prior to depositing the insulating layer 21 as shown in FIGS. 4A and 4B, thermal oxidation is performed to form the silicon dioxide film on the whole surface of the silicon substrate 11. However, it is not necessary that the silicon substrate 11 is entirely coated by the insulating film 18. The insulating film 18 is formed at least on the bottom 12a and side 12b of the recess 12, and the top surface of the substrate 11.

On the silicon substrate 11 on which the insulating film 18 is formed, the wiring layers 13 are formed by the same processes as above described. The insulating film 18 can be used as an etching mask for forming the slits 16 by etching the silicon substrate 11.

Although a silicon substrate is employed as a material for the implementation base in the embodiment, other appropriate insulating substrates may also be employed. As the wiring layer, appropriate conductive materials other than Al can also be employed.

Figure 14:
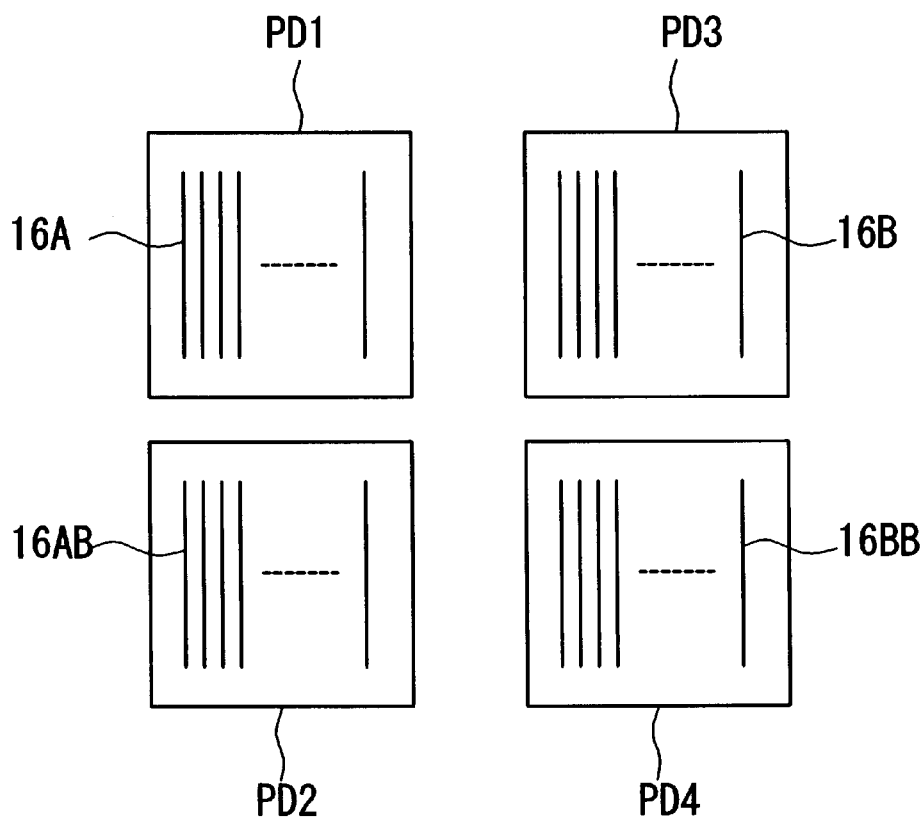
FIG. 14 shows a layout of the optical grating formed of slits 16 and the photodiodes in the photodetector chip 14 in FIGS. 11A and 11B.

In the sensor head shown in FIGS. 11A and 11B, the index optical gratings formed of the slits 16 are disposed in front of the photodetector chip 14. In this case, in order to output 4-phases (i.e., A-, AB-, B- and BB-phases) displacement signals, as shown in FIG. 14, it is necessary to arrange index gratings 16A, 16AB, 16B and 16BB that are formed of slits 16, and to dispose 4 photodiodes PD1 to PD4 in the detector chip 14 corresponding to the respective index gratings.

Figure 15:
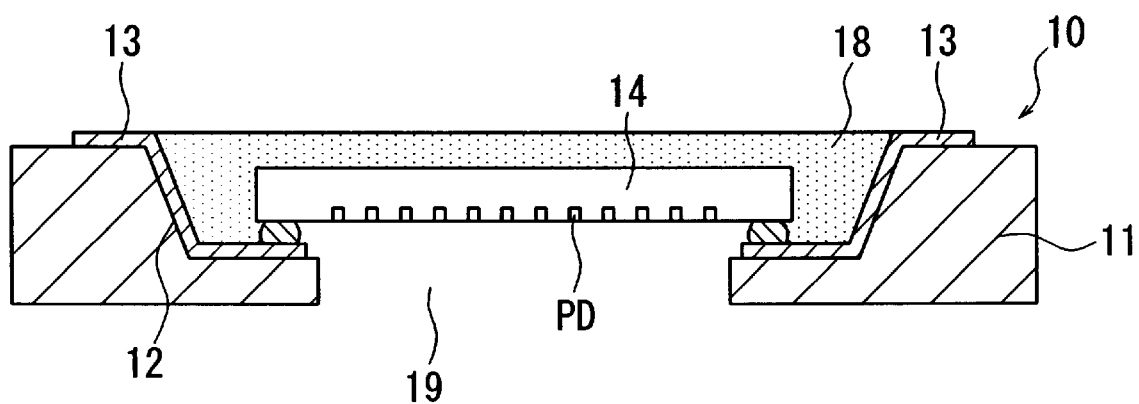
FIG. 15 is a cross sectional view of another sensor head, which corresponds to FIG. 11B.
Figure 16:
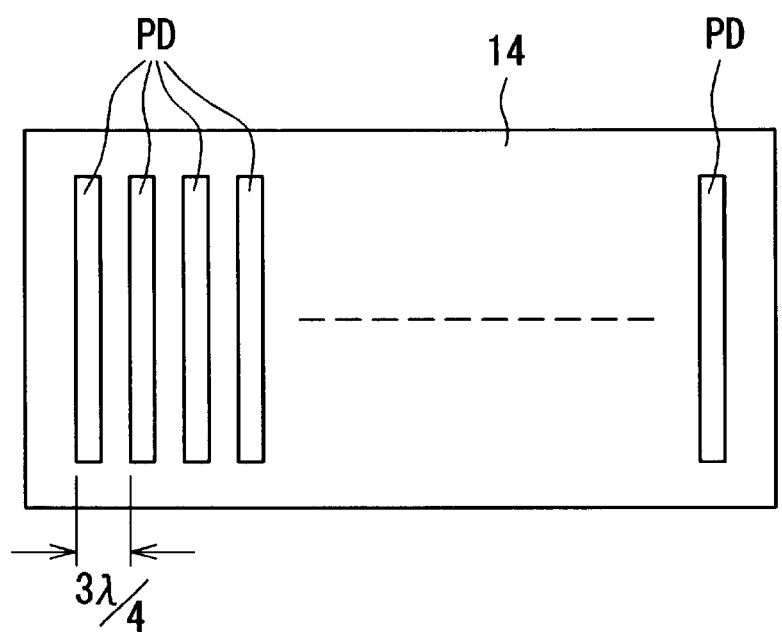
FIG. 16 shows a layout of the photodiode array of the photodetector chip in FIG. 15.

By contrast, in such a case that the sensor head is formed such a type as to have no optical index grating in front of the photodetector chip, the sensor head may be formed as shown in FIGS. 15 and 16. FIG. 15 is a cross sectional view corresponding to FIG. 11A. FIG. 16 shows a layout of the photodetector array in the photodetector chip 14. As shown in these drawings, plural rectangular photodiodes PD are arranged, for example, at a pitch of 3 $\lambda/4$ ($\lambda$: scale grating pitch) so as to outputting A-,BB-,AB- and B-phase displacement signals. At the bottom of the silicon substrate 11, as shown in FIG. 15, an aperture 19 is formed so as to open to the photo receiving surface of the photodetector chip 14.

As obvious from the forgoing, for the purpose of forming a wiring layer from the bottom of a recess to the upper surface, a method is employed to form a groove for burying a wire and bury a conductive layer in the groove. Therefore, according to the present invention, even if the recess in the implementation base has a deep step, the wiring layer can be formed reliably. In addition, flip-chip mounting of semiconductor devices in such the implementation base can achieve a functional device unit that is excellent in mechanical reliability and electrical performance.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A functional device unit comprising:
   an insulating substrate having a recess formed in a surface thereof;
   a wiring layer patterned on the surface of said substrate, said wiring layer continuously extending from the bottom of said recess to the top surface of said substrate via the side of said recess; and
   a semiconductor device implemented in said recess of said substrate in a flip-chip manner, wherein said substrate is a silicon substrate, and an insulating film is formed at least on the bottom and the side of said recess, and the top surface of the substrate.

2. The functional device unit according to claim 1, wherein said semiconductor device is sealed in a plastic.

3. A functional device unit, comprising:
   an insulating substrate having a recess formed in a surface thereof;
   a wiring layer patterned on the surface of said substrate, said wiring layer continuously extending from the bottom of sad recess to the top surface of said substrate via the side of said recess; and
   a semiconductor device implemented in said recess of said substrate in a flip-chip manner, wherein said functional device unit is a sensor head of an optical encoder, said semiconductor device is a photodetector chip, and said recess of said substrate has a plurality of slits formed on the bottom for configuring optical gratings opposite to a photoreceiving surface of said photodetector chip.

4. The functional device unit according to claim 3, wherein said semiconductor device is sealed in a plastic.

5. A functional device unit, comprising:
   an insulating substrate having a recess formed in a surface thereof;
   a wiring layer patterned on the surface of said substrate, said wiring layer continuously extending from the bottom of said recess to the top surface of said substrate via the side of said recess; and
   a semiconductor device implemented in said recess of said substrate in a flip-chip manner, wherein said functional device unit is a sensor head of an optical encoder, said semiconductor device is a photodetector chip on which a photodetector array is formed, and said recess of said substrate has an aperture open to a photoreceiving surface of said photodetector chip.

6. The functional device unit according to claim 5, wherein said semiconductor device is sealed in a plastic.

7. A functional device unit, comprising:
   an insulating substrate having a recess formed in a surface thereof;
   a wiring layer patterned on the surface of said substrate, said wiring layer continuously extending from the bottom of said recess to the top surface of said substrate via the side of said recess; and
   a semiconductor device implemented in said recess of said substrate in a flip-chip manner, wherein said functional device unit is a hybrid photodetector unit, and wherein a semiconductor light emitting device chip, a photodetector chip, and a signal processing IC chip for processing an output signal from said photodetector chip are implemented in said recess of said substrate in a flip-chip manner.

8. A method of producing a functional device unit comprising the steps of:
   forming a recess in a surface of an insulating substrate;
   forming a wiring layer patterned on the surface of the substrate, said wiring layer continuously extending from the bottom of said recess to the top surface of said substrate via the side of said recess; and
   implementing a semiconductor device in said recess of said substrate in a flip-chip manner,
   wherein the step of forming said wiring layer comprises:
      burying an insulating layer in said recess, to planarize said substrate, said insulating layer consisting of a material different from said substrate,
      forming a photoresist mask on said substrate planarized with said insulating layer buried, said photoresist mask having a groove for wire-burying, said groove continuously extending from the top of said insulating layer to the outside of said recess,
      etching said insulating layer to remove parts exposing through said groove of said photoresist mask,
      depositing a conductive layer over said resist mask remaining on said substrate to form said wiring layer in said groove, said wiring layer continuously extending from the bottom of and via the side of said recess to the top surface of said substrate, and
      removing said photoresist mask and said insulating layer successively.

9. The method according to claim 8, wherein said substrate is a silicon substrate, the method further comprising the step of forming a silicon dioxide film on the silicon substrate by thermal oxidation after the recess forming and prior to the insulating layer burying.

10. The method according to claim 8, wherein said insulating layer is an organic layer.

11. The method according to claim 8, wherein said insulating layer is an inorganic layer.

12. The method according to claim 8, wherein said functional device unit is a sensor head of an optical encoder, and said semiconductor device is a photodetector device chip, said method further comprising the step of forming slits for configuring optical gratings on the bottom of said recess of said substrate prior to implementation of said semiconductor device.

13. The method according to claim 8, wherein said functional device unit is a sensor head of an optical encoder, and said semiconductor device is a photodetector device chip on which a photodetector device array is formed, the method further comprising the step of forming an aperture open to a receiving surface of said photodetector device chip on the bottom of said recess of said substrate prior to implementation of said semiconductor device.

* * * * *